United States Patent [19]

Ohata et al.

[11] Patent Number: 4,837,186
[45] Date of Patent: Jun. 6, 1989

[54] SILICON SEMICONDUCTOR SUBSTRATE WITH AN INSULATING LAYER EMBEDDED THEREIN AND METHOD FOR FORMING THE SAME

[75] Inventors: Yu Ohata, Tokyo; Tsuyoshi Kuramoto; Masaru Shimbo, both of Yokohama, all of Japan

[73] Assignee: Kabushiki Kaisha Toshiba, Kawasaki, Japan

[21] Appl. No.: 84,209

[22] Filed: Aug. 12, 1987

Related U.S. Application Data

[60] Division of Ser. No. 60,979, Jun. 10, 1987, abandoned, which is a continuation of Ser. No. 770,089, Aug. 28, 1985, abandoned.

[30] Foreign Application Priority Data

Aug. 31, 1984 [JP] Japan .................. 59-181817

[51] Int. Cl.$^4$ .......................................... H01L 21/265
[52] U.S. Cl. .................. 437/228; 148/DIG. 12; 437/24
[58] Field of Search ............. 437/946, 64, 67, 69, 437/59; 148/DIG. 85, DIG. 12

[56] References Cited

U.S. PATENT DOCUMENTS 3,386,865 6/1968 Doo ........................ 437/64
3,391,023 7/1968 Frescura ................. 148/DIG. 85
3,393,349 7/1968 Huffman ................. 148/DIG. 85
3,508,980 4/1970 Jackson et al. ........... 148/DIG. 85
4,638,552 1/1987 Shimbo et al. .................. 437/31

FOREIGN PATENT DOCUMENTS 0232935 8/1987 European Pat. Off. .... 148/DIG. 12
0162046 9/1983 Japan .................................... 437/64
0236210 11/1985 Japan ........................ 148/DIG. 12

OTHER PUBLICATIONS

J. Electrochem. Soc.: Solid State Science and Technology, Aug. 1986, vol. 133, No. 8, pp. 1673-1677.

Primary Examiner—Brian E. Hearn
Assistant Examiner—Tuan Nguyen
Attorney, Agent, or Firm—Finnegan, Henderson, Farabow, Garrett, & Dunner

[57] ABSTRACT

A silicon semiconductor substrate includes an insulating layer embedded therein. The silicon semiconductor substrate comprises a first silicon plate, an insulating layer embedded in the first silicon plate so that the surfaces of the silicon plate and the insulating layer are in a mirror surface, and a second silicon plate united with the first silicon plate and the insulating layer at the mirror surface of the first silicon plate and the insulating layer. The insulating layer is used for forming an isolated region in the second silicon plate.

1 Claim, 5 Drawing Sheets

SILICON SEMICONDUCTOR SUBSTRATE WITH AN INSULATING LAYER EMBEDDED THEREIN AND METHOD FOR FORMING THE SAME

This is a division of application Ser. No. 060,979, filed June 10, 1987 which is a continuation of Ser. No. 770,089 filed Aug. 28, 1985.

BACKGROUND OF THE INVENTION

The present invention relates to a silicon semiconductor substrate and, more particularly, to a silicon semiconductor substrate with an insulating layer embedded therein in which an insulating layer to form an electrically isolated semiconductor region is included therein and to a method for forming the same.

In monolithic semiconductor integrated circuits, as methods for forming an isolated region to isolate a semiconductor element or elements from another element or other elements, methods whereby a reverse-biased P-N junction is used or methods whereby an insulating layer is used are adopted. One of the methods whereby the P-N junction is used is shown in FIG. 1. In FIG. 1, $N^-$-type monocrystalline silicon layer 2 is epitaxially grown on a $P^-$-type monocrystalline silicon substrate 1. A $P^+$-type diffusion layer 3 is formed by selectively diffusing P-type impurities of a high concentration such that the layer 3 reaches from the upper surface of the monocrystalline layer 2 to the silicon substrate 1. An $N^-$-type silicon layer 4 (isolated region) surrounded by the diffusion layer 3 (isolating region) and the silicon substrate 1 is electrically isolated from other semiconductor regions by applying a reverse bias to the P-N junction. A predetermined semiconductor element or elements are formed in the $N^-$-type silicon layer 4. Although the isolated region 4 shown in FIG. 1 can be cheaply realized, there is a drawback such that the area to form the $P^+$-type diffusion layer 3, namely, the isolating region becomes large.

To solve the drawback in FIG. 1, a method whereby an isolated region is formed as shown in FIG. 2 is known. In FIG. 2, a $P^+$-type high concentration layer 5 is formed in the $P^-$-type silicon substrate 1 by way of an ion implantation. Thereafter, similarly to FIG. 1, the N- epitaxial layer 2 is formed on the substrate 1 and a $P^+$-type diffusion layer 7 is formed from the upper surface of this epitaxial layer by way of a diffusion. By applying a reverse bias to the P-N junction formed in this way, the isolated $N^-$-type region 4 is formed. The $P^+$-type diffusion layer 7 is formed by way of the diffusion from the upper surface into the epitaxial layer 2 and the diffusion from the $P^+$-type high concentration layer 5; therefore, there are advantages such that the layer 7 is formed in a short time and the widths in the lateral direction of the isolating regions 5 and 7 can be made small. However, in FIG. 2, the circuit to apply the reverse bias potential to the P-N junction is needed and a leak current in the P-N junction exerts an influence on the characteristic of the semiconductor element formed in the isolated region 4. Even in FIG. 2 as well, the area of the isolating region cannot be made sufficiently small and also it is improper to form a high voltage semiconductor element in the isolated region.

As one of the methods whereby an insulating layer is used to form an isolated region, a structure as shown in FIG. 3 is known. In FIG. 3, the $N^-$ layer 2 is epitaxially grown on the upper surface of the $P^-$-type silicon substrate 1. A groove 10 is formed so as to reach from the main surface (free surface) of the $N^-$ layer 2 to the $P^-$-type substrate 1. After a thermal silicon dioxide layer 11 was formed on the inner surface of the groove 10, a polycrystalline silicon material 12 in which no impurity is doped is embedded into the groove 10. According to this method, the isolating region area to form the isolated region 4 can be made small. However, to electrically isolate the isolated region 4, a circuit to apply a reverse bias between the $N^-$ region 4 and the $P^-$ substrate 1 is needed and also a leak current is generated through this P-N junction.

FIGS. 4A and 4B show a well-known method whereby an isolated region is formed by only an insulating layer. In FIG. 4A, a groove 15 is formed by performing a selective etching to a predetermined region of an N-type silicon substrate 14. Further, a silicon dioxide layer 16 is formed on the surface of the groove 15. A polycrystalline silicon layer 17 in which no impurity is doped is formed on the silicon dioxide layer 16. Next, the N-type silicon substrate 14 is ground until it reaches from its free surface to the groove 15. Thus, an isolated region 18 surrounded by the silicon dioxide layer 16 is formed as an island region. However, the semiconductor substrate shown in FIGS. 4A and 4B is insulated by the free surface (upper surface) of the N-type silicon substrate 14, the free surface (lower surface) of the polycrystalline silicon layer 17, and the silicon dioxide layer 16. Consequently, the polycrystalline silicon layer 17 cannot be used as a path of a current and also such a semiconductor substrate becomes expensive.

SUMMARY OF THE INVENTION

It is an object of the present invention to provide a silicon semiconductor substrate with an insulating layer embedded therein in which an insulating layer to form an electrically isolated region is embedded in a part of the inside of this substrate.

Another object of the invention is to provide a method of manufacturing a silicon semiconductor substrate with an insulating layer embedded therein in which an insulating layer to form an electrically isolated region is embedded inside of this substrate.

To accomplish the above objects, a silicon semiconductor substrate comprises: a first monocrystalline silicon plate having a first surface; a first insulating layer embedded in the first monocrystalline silicon plate such that the level of the first surface of the first insulating layer coincides with the level of the first surface of the first monocrystalline silicon plate; and a second monocrystalline silicon plate having first and second surfaces and united with the first monocrystalline silicon plate and the first insulating layer at the first surfaces of the first monocrystalline silicon plate and the first insulating layer and at the second surface of the second monocrystalline silicon plate.

A manufacturing method according to the present invention comprises: a step for forming a first silicon dioxide layer on a first surface of a first monocrystalline silicon plate; a step for forming a silicon nitride layer on the first silicon dioxide layer; a step for removing the silicon nitride layer on a predetermined region; a step for forming a second silicon dioxide layer on the predetermined region; a step for removing the remaining silicon nitride layer; a step for applying a resist layer on the surfaces of the second silicon dioxide layer and the first silicon dioxide layer remaining on the first surface of the first monocrystalline silicon plate, the free surface of the resist layer being made flat; a step for etching the resist layer and the second silicon dioxide layer until the level of the free surface of the second silicon dioxide layer coincides with the surface level of the first silicon dioxide layer by using the reactive ion etching method; a step for removing an upper part of the second silicon dioxide layer and the first silicon dioxide layer until the first silicon dioxide layer is completely removed; and a step for uniting a second monocrystalline silicon plate with the first monocrystalline silicon plate and the second silicon dioxide layer at their mutual contacting surfaces.

DETAILED DESCRIPTION OF THE PREFERRED EMBODIMENTS

Figure 5:
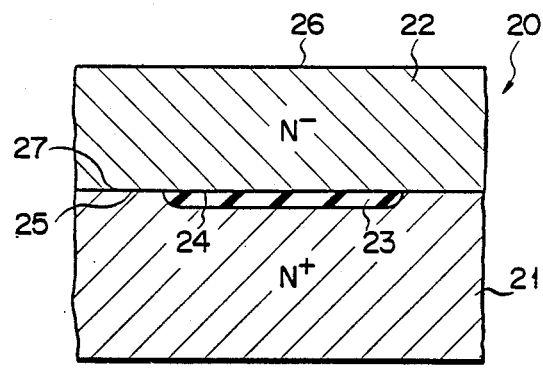
FIG. 5 is a cross sectional view of a silicon semiconductor substrate according to the present invention.

In FIG. 5 showing one embodiment of the present invention, a semiconductor substrate 20 includes a first $N^+$-type crystalline silicon plate 21, a second $N^-$-type crystalline silicon plate 22, and a silicon dioxide ($SiO_2$) layer 23. The $SiO_2$ layer 23 is embedded in the first crystalline Si plate 21 such that the level of a first surface 24 of the layer 23 coincides with the level of a first surface 25 of the first crystalline Si plate 21. The first surface 24 of the $SiO_2$ layer 23 and the first surface 25 of the first crystalline Si plate 21 form a mirror surface. The second $N^-$-type crystalline Si plate 22 has a first surface 26 and a second surface 27. The second surface 27 is formed as a mirror surface. The second surface 27 of the crystalline Si plate 22 is joined to the first surface 25 of the first crystalline plate 21 and to the first surface 24 of the $SiO_2$ layer 23, respectively, and the first crystalline plate 21 and the second crystalline plate 22 are united. As mentioned later, the $SiO_2$ layer 23 is used to form an isolated region in the second crystalline plate 22 which faces the layer 23.

The first crystalline Si plate 21 and the second crystalline Si plate 22 may be of the different conductivity types. On one hand, the $SiO_2$ layer 23 may be replaced by a silicon nitride ($Si_3N_4$) layer or a polycrystalline layer in which no impurity is doped.

Figure 6A:
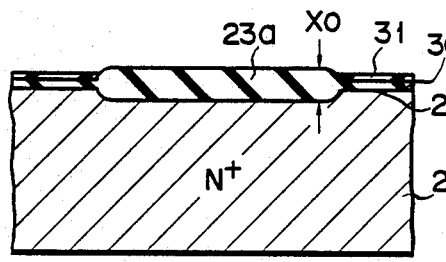
FIGS. 6A to 6D are cross sectional views to explain a method of manufacturing the silicon semiconductor substrate shown in FIG. 5.

One method of manufacturing the silicon semiconductor substrate shown in FIG. 5 will then be explained with reference to FIGS. 6A to 6D. A thermal silicon dioxide layer ($SiO_2$) 30 is formed on the first surface 25 of the $N^+$-type monocrystalline silicon plate 21 (the first Si plate). A silicon nitride layer ($Si_3N_4$) 31 is formed on the $SiO_2$ layer 30. After a predetermined region of the $Si_3N_4$ layer was removed by way of an etching, it is subjected to a thermal oxidation at a high temperature. The $SiO_2$ layer under the $Si_3N_4$ layer does not grow, due to this thermal oxidation, but where the $Si_3N_4$ layer was removed the $SiO_2$ does grow. Therefore, a thick thermal silicon dioxide layer 23a is formed in the foregoing predetermined region. The thickness of the $SiO_2$ layer is controlled so as to become, for example, $X_O$. It is apparent that the level of the upper surface of the thermal $SiO_2$ layer 23a is higher than the level of the first surface 25 of the first monocrystalline plate 21 and the level of the lower surface is lower than the level of the first surface 25 of the first monocrystalline plate. The above-mentioned steps are shown in FIG. 6A. Then, the remaining $Si_3N_4$ layer 31 is removed. Thereafter, a resist layer 33 is coated on the upper surface of the $SiO_2$ layer 30 and on the upper surface of the thermal $SiO_2$ layer 23a, making the surface of the resist layer 33 flat (refer to FIG. 6B for these steps). Next, the resist layer 33 and $SiO_2$ layer 23a are etched until the surface level of the $SiO_2$ layer 23a coincides with the surface level of the $SiO_2$ layer 30 at the same etching ratio by way of an RIE (Reactive Ion Etching) method. Thereafter, an upper portion of the $SiO_2$ layer 23a and the $SiO_2$ layer 30 are removed by $NH_4F$ solution until the surface level of the remaining portion 23 of the $SiO_2$ layer 23a and the level of the first surface 25 of the first silicon plate 21 are formed as a mirror surface (refer to FIG. 6C). Then, the second $N^-$ monocrystalline silicon plate 22 having the first surface 26 and the second surface 27 formed as a mirror surface is prepared. The second surface 27 comes into contact with the upper surface 25 of the first silicon plate 21 and with the upper surface of the thermal $SiO_2$ layer 23 in a dustless atmosphere. The united member of the first and second silicon plates, namely, the semiconductor substrate 20 is subjected to the heat treatment at temperatures over 200° C., so that the first and second silicon plates 21 and 22 are rigidly united. The $SiO_2$ layer 23 is embedded in the substrate 20.

Figure 6B:
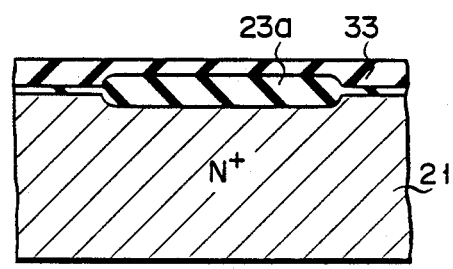
Figure 6C:
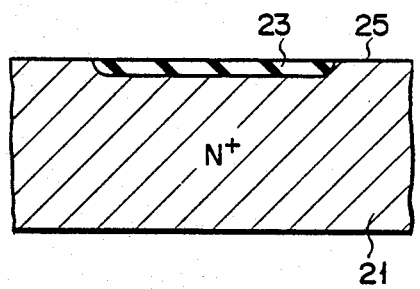
Figure 6D:
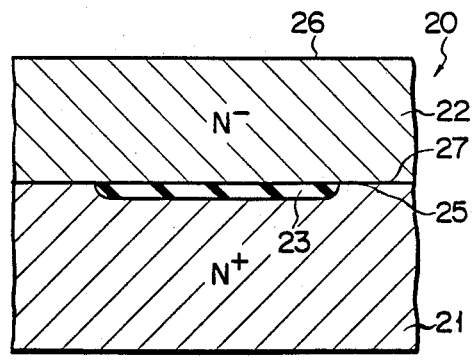
Figure 7A:
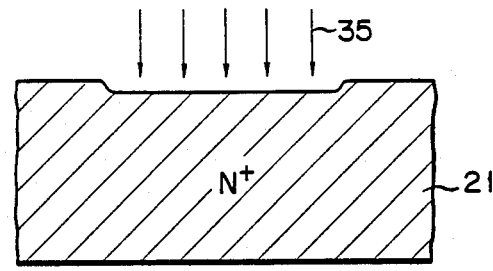
FIGS. 7A to 7E are cross sectional views to explain another method of manufacturing the silicon semiconductor substrate shown in FIG. 5.
Figure 7B:
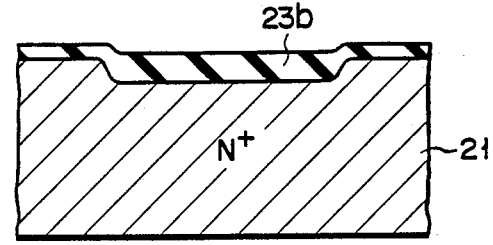
Figure 7C:
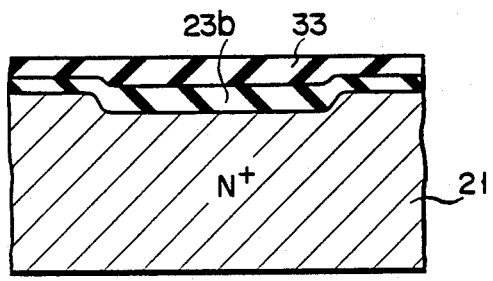
Figure 7D:
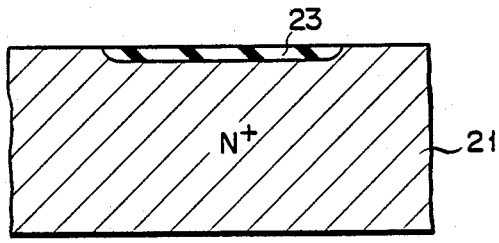
Figure 7E:
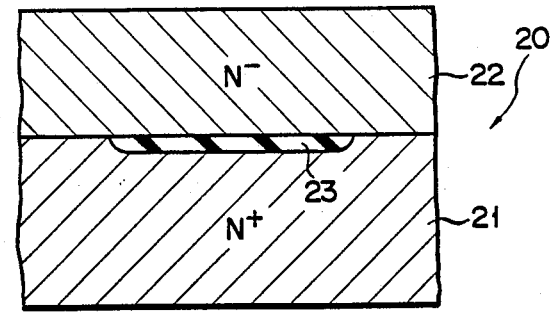

Another method of manufacturing the silicon semiconductor substrate according to the present invention will then be explained with reference to FIGS. 7A to 7E. After only a predetermined region of the first $N^+$-type silicon plate 21 was etched, impurities 35 such as $O_2$, P or As (which are selected in accordance with the semiconductor device) or the like are doped into the predetermined region at a high concentration (refer to FIG. 7A). Thereafter, the first silicon plate 21 is subjected to a thermal oxidation at a high temperature, so that an $SiO_2$ layer 23b is formed as shown in FIG. 7B since the thermal oxidation speed at the predetermined region in which the impurities were doped is higher than the thermal oxidation speed at another region. The resist layer 33 for a photo-etching is coated on the thermal $SiO_2$ layer 23b such that the surface becomes flat (FIGS. 7C which is the same as FIG. 6B). Then, the resist layer 33 and a part of the $SiO_2$ layer 23b are removed by way of the RIE method (refer to FIG. 7D). The remaining portion of the $SiO_2$ layer is indicated at 23. Since the step of FIG. 7D is the same as the step of FIG. 6C, its description is omitted. Next, the lower surface of the second silicon plate 22 is united on the upper surface of the first silicon plate 21 and on the upper surface of the SiO₂ layer 23 and then they are subjected to the heat treatment, so that the semiconductor substrate 20 of the present invention is obtained (FIG. 7E). Since the step of FIG. 7E is the same as the step of FIG. 6D, its detailed description is omitted.

Figure 1:
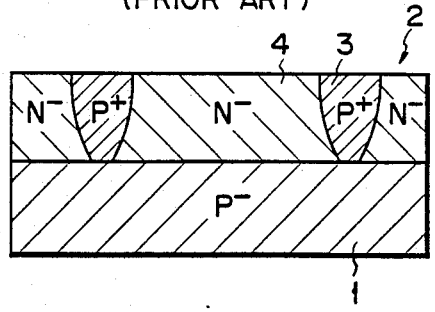
FIGS. 1 and 2 are cross sectional views of conventional semiconductor substrates each of which includes an isolated region formed by a diffused semiconductor region.
Figure 2:
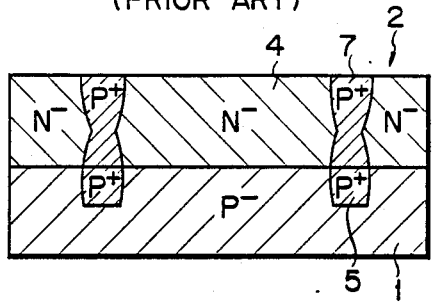
Figure 3:
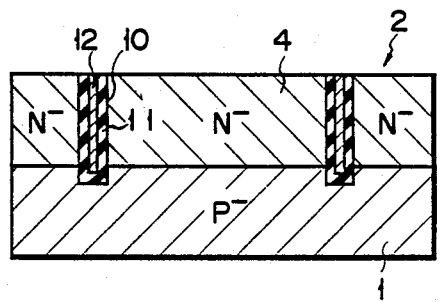
FIG. 3 is a cross sectional view of a conventional semiconductor substrate including an isolated region formed by using both an insulating layer and a P-N junction.
Figure 4A:
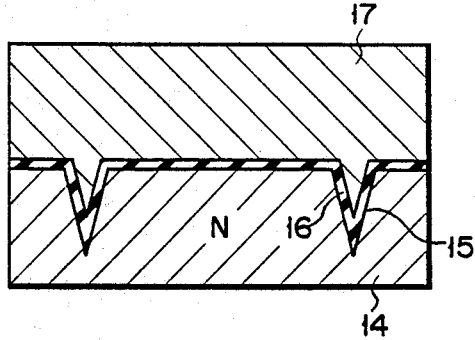
FIGS. 4A and 4B are cross sectional views of a conventional semiconductor substrate including isolated regions formed by only insulating layers.
Figure 4B:
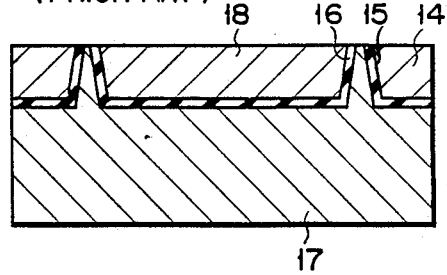
Figure 8A:
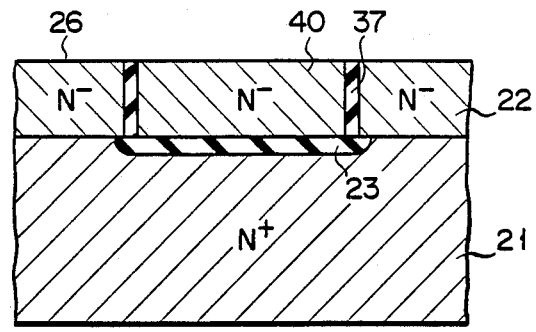
FIGS. 8A to 8C are cross sectional views to explain a method for forming an isolated region using the silicon semiconductor substrate shown in FIG. 5.
Figure 8B:
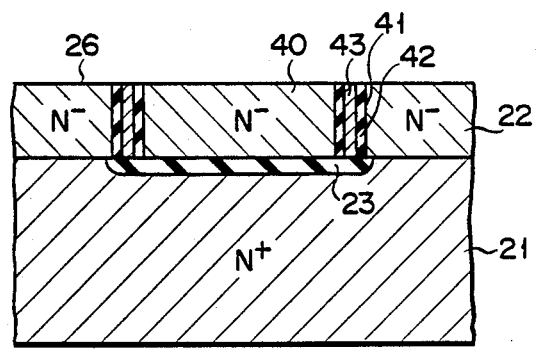
Figure 8C:
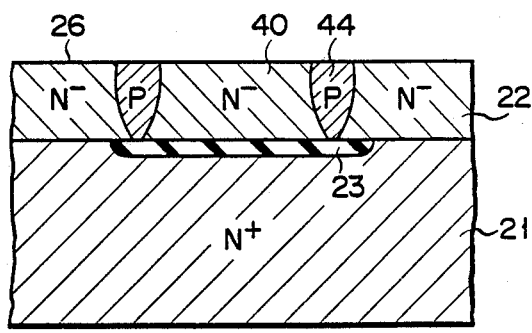

Examples whereby an isolated region is formed in the second silicon plate 22 using the silicon semiconductor substrate 20 shown in FIG. 5 of the present invention will now be described with reference to FIGS. 8A to 8C. In FIG. 8A, if a second insulating layer 37 (SiO₂ layer) which reaches from the upper surface 26 to the upper surface of the first insulating layer 23 is formed in the region of the second silicon plate 22, an isolated region 40 can be formed. On the other hand, a structure shown in FIG. 8B may be adopted in place of the second insulating layer 37. In other words, a hole 41 which reaches from the upper surface 26 to the upper surface of the SiO₂ layer 23 is formed and an SiO₂ layer 42 is formed on the inner surface of this hole. Then, a polycrystalline material 43 in which no impurity is doped is filled in the hole 41. Further, as shown in FIG. 8C, a P-type diffusion region 44 which reaches from the upper surface 26 to the upper surface of the SiO₂ layer 23 may be formed. However, this method cannot completely eliminate the drawbacks mentioned in conjunction with FIGS. 1 to 3.

Figure 9A:
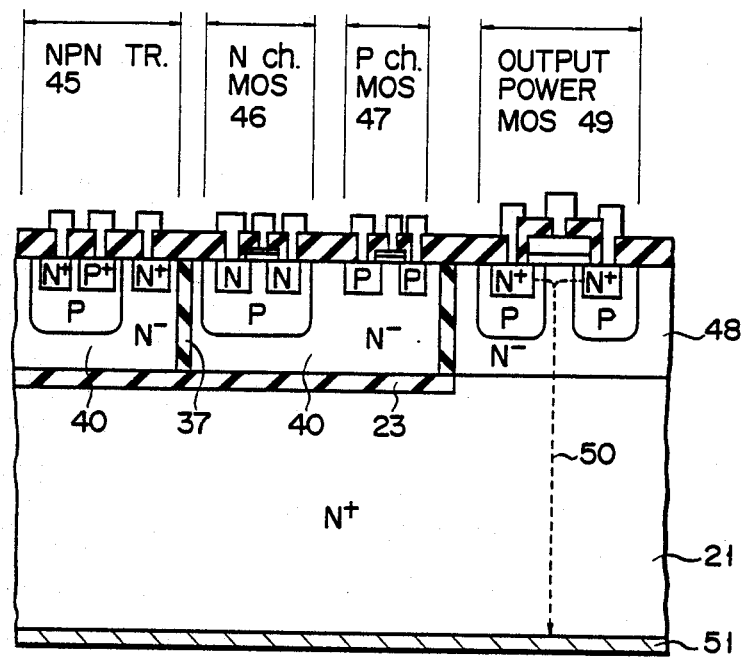
FIGS. 9A and 9B are cross sectional views to explain the relation between the silicon semiconductor substrate shown in FIG. 5 and the semiconductor elements formed on this substrate.

An example whereby semiconductor elements are formed in the silicon semiconductor substrate of the present invention will then be explained with reference to FIGS. 9A and 9B. In FIG. 9A, an NPN transistor 45 serving as a control circuit of an IC is formed in one isolated region 40; an N channel MOS transistor 46 and a P channel MOS transistor 47 serving as a control circuit of an IC are likewise formed in the other separated region 40; and an output power MOS transistor 49 is formed in a non-isolated region 48. A drain current 50 of the MOS transistor 49 is taken out through a drain electrode 51 provided on the second surface of the first silicon plate 21.

Figure 9B:
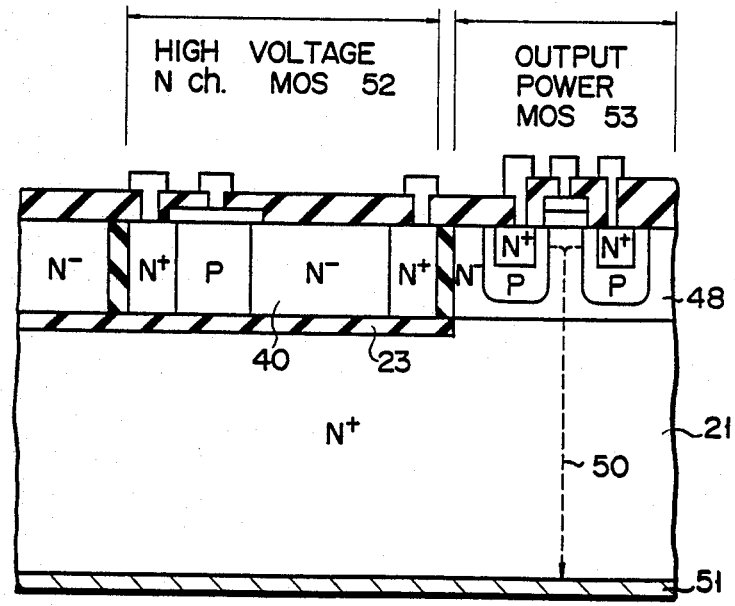

In FIG. 9B, a high voltage MOS transistor 52 of the N channel type which is necessary for a control circuit of an IC is formed in the separated region 40, and an output power MOS transistor 53 is formed in the non-isolated region.

As described above, the isolated region 40 can be easily formed using the first insulating layer 23 and second insulating region (for example, 37 in FIG. 8A) in the substrate according to the present invention. Therefore, the integration degree of the semiconductor element can be improved and also since the isolated regions are not formed by the P-N junction, the high voltage elements can be easily formed in these isolated regions. In addition, since the non-separated region exists, for instance, a high output power MOS transistor is formed in this non-separated region and the electrode (for example, 51 in FIG. 9A) provided on the lower surface of the substrate 20 may be used as a current path. A limitation of the potential to the circuit constituted on the substrate, a parasitic effect or the like can be released.

What is claimed is:

1. A method of manufacturing the silicon semiconductor substrate with an insulating layer embedded therein comprising the steps of:

forming a first silicon dioxide layer on a first surface of a first monocrystalline silicon plate;

forming a silicon nitride layer on said first silicon dioxide layer;

removing said silicon nitride layer on a predetermined region;

forming a second silicon dioxide layer on said predetermined region;

removing the remaining silicon nitride layer;

applying a resist layer on the surfaces of said second silicon dioxide layer and said first silicon dioxide layer remaining on said first surface of said first monocrystalline silicon plate, the free surface of said resist layer being made flat;

etching said resist layer and said second silicon dioxide layer until the level of the free surface of said second silicon dioxide layer coincides with the surface level of the first silicon dioxide layer by using the reactive ion etching method;

removing a upper part of said second silicon dioxide layer and said first silicon dioxide layer until said first silicon dioxide layer is completely removed; and uniting a second monocrystalline silicon plate with said first monocrystalline silicon plate and said second silicon dioxide layer at their mutual contacting surfaces.

* * * * *